(12) United States Patent
Huang et al.

(10) Patent No.: US 10,770,159 B2
(45) Date of Patent: Sep. 8, 2020

(54) ANTIFUSE DEVICE AND METHOD OF OPERATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Tsai-Yu Huang, Hsinchu County (TW); Pin-Yao Wang, Hsinchu (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/027,358

(22) Filed: Jul. 4, 2018

(65) Prior Publication Data

US 2019/0057754 A1 Feb. 21, 2019

(30) Foreign Application Priority Data

Aug. 16, 2017 (CN) .......................... 2017 1 0701041

(51) Int. Cl.

| | |
|---|---|
| *G11C 17/00* | (2006.01) |
| *G11C 17/16* | (2006.01) |
| *H01L 23/525* | (2006.01) |
| *H01L 23/522* | (2006.01) |
| *H01L 27/108* | (2006.01) |
| *G11C 17/18* | (2006.01) |
| *H01L 49/02* | (2006.01) |
| *G11C 11/00* | (2006.01) |
| *H01L 27/112* | (2006.01) |
| *G11C 29/00* | (2006.01) |
| *G11C 11/401* | (2006.01) |

(52) U.S. Cl.
CPC ............ *G11C 17/16* (2013.01); *G11C 11/005* (2013.01); *G11C 17/18* (2013.01); *G11C 29/70* (2013.01); *H01L 23/5223* (2013.01); *H01L 23/5252* (2013.01); *H01L 27/10897* (2013.01); *H01L 27/11206* (2013.01); *H01L 28/40* (2013.01); *H01L 28/91* (2013.01); *G11C 11/401* (2013.01)

(58) Field of Classification Search
CPC ...................................................... G11C 17/16
USPC ........................................................... 365/96
See application file for complete search history.

(56) References Cited

U.S. PATENT DOCUMENTS

| | | | |
|---|---|---|---|
| 6,150,706 | A | 11/2000 | Thakur |
| 6,680,520 | B2 | 1/2004 | Voldman |
| 6,822,888 | B2 | 11/2004 | Peng |
| 7,218,547 | B2 | 5/2007 | Kurth |

(Continued)

FOREIGN PATENT DOCUMENTS

| | | |
|---|---|---|
| CN | 103545290 A | 1/2014 |
| CN | 106057780 A | 10/2016 |

*Primary Examiner* — Hoai V Ho
(74) *Attorney, Agent, or Firm* — Winston Hsu

(57) ABSTRACT

An antifuse device is disclosed. The antifuse device includes a plurality of active regions, a plurality of word lines extending along a first direction and cut through the active regions, a plurality of bit lines and a plurality of source lines extending along a second direction and stride across the active regions. The bit lines and the source lines are arranged alternatively along the first direction. Plural antifuse capacitors are disposed along the source lines and connected between the source lines and the active regions.

20 Claims, 12 Drawing Sheets

(56) References Cited

U.S. PATENT DOCUMENTS 8,022,503 B2 9/2011 Shih
2011/0122672 A1* 5/2011 Kodama ................ G11C 17/16
365/96

* cited by examiner

|  | Source line control signal | Bit line control signal | Word line control signal | Substrate |
|---|---|---|---|---|
| 160A | 2.5-3.6 | -0.7 | 2.5 | -0.7 |
| 160B | 0 | -0.7 | -0.3 | -0.7 |
| 160C | 2.5-3.6 | 1.2 | 2.5 | -0.7 |
| 160D | 0 | 1.2 | -0.3 | -0.7 |

Unit: Voltage (V)

|      | Source line control signal | Bit line control signal | Word line control signal | Substrate |
|------|------|------|------|------|
| 160A | 1.2 | Read | 2.5 | -0.7 |
| 160B | 0 | Read | -0.3 | -0.7 |
| 160C | 1.2 | Floating | 2.5 | -0.7 |
| 160D | 0 | Floating | -0.3 | -0.7 |

Unit: Voltage (V)

ANTIFUSE DEVICE AND METHOD OF OPERATING THE SAME

BACKGROUND OF THE INVENTION

1. Field of the Invention

The present invention generally relates to a semiconductor device. More particularly, the present invention relates to an antifuse device and method of operating the same.

2. Description of the Prior Art

In conventional semiconductor technology, an antifuse device is usually employed to repair defective circuitries or as programmable linking devices. For example, when a chip is found to have defective circuit elements, antifuse devices incorporated in the circuitry of the chip and associated between the defective circuit elements and corresponding repairing circuit elements may be activated to re-route the circuitry to bypass the defective elements and connect to the repairing circuit elements. On the other hand, an antifuse device may include a plurality of antifuse cells configured into a programmable memory array that each antifuse cell may represent "1" or "0" by whether the antifuse cell is in a conductive state or in a non-conductive state.

A typical antifuse cell may include a metal-insulator-metal (MIM) structure. In the process of programming an antifuse cell, a pre-determined voltage may be applied across the two metal layers of the MIM structure such that the insulator layer sandwiched therebetween may be broken down and current may conduct between the two metal layers. The antifuse is therefore in a conductive state and may be regarded as "1". Otherwise, an antifuse in a non-conductive state, that is, no current is conducted between the two metal layers of the MIM may be regarded as "0".

Antifuse devices have been widely employed in semiconductor chips for the advantage of allowing the programming after either the wafer level test (referred to as the CP test) or the package level test (referred to as the FT test). For example, antifuse devices have been widely used in DRAM devices for repairing defective portions of the DRAM devices. Please refer to the left portion of FIG. 1, which exemplarily illustrates a convention DRAM chip 10 that includes an array of the memory device 22, an array of the antifuse device 26 and a region of the logic circuit 24 connected between the antifuse device 26 and the memory device 22. The antifuse device 26 may be programmed to store the address information of the defective bits (or columns and rows) of the memory device 22. When programming or reading from the memory device 22, circuit paths directing to the defective bits of the memory device 22 may be re-route to the redundant memory cells by the logic circuit 24 according to the address information stored in the antifuse device 26. The defective bits of the memory device 22 are therefore bypassed and the failure of the memory device 22 is repaired.

Please refer to the right portion of FIG. 1, which illustrates a schematic circuit diagram of a conventional DRAM-based antifuse device 26. The antifuse device 26 includes a plurality of antifuse cells 260 arranged into an array along columns and rows. Each antifuse cell 260 includes a gate G and a capacitor C. The gate G is controlled by a column word line (WL) and has two terminals respectively connected to a row of bit line (BL) and the capacitor C. The capacitor C is connected between the gate G and a common terminal A that is connected to all capacitors C of the antifuse device 26 in the manner as a DRAM array has the top electrodes all connected to a common terminal. The gates G arranged along the same column are controlled by the same word line, and the gates G arranged along the same row are connected to the same bit line. The capacitor C of a programmed antifuse cell 260 (indicated by the arrow) may be equivalent to a resistor having a high conductivity with respect to the circuit. However, the antifuse device 26 as shown in FIG. 1 is found susceptible to poor programming efficiency or reading errors for that the programmed capacitor C (indicated by the arrow) may cause interferences to the selected antifuse cells 260 of the same column.

Therefore, there is still a need in the field to provide an antifuse device that may be conveniently integrated into the chip of the DRAM device and may prevent the aforesaid problems.

SUMMARY OF THE INVENTION

In light of the above, the present invention is directed to provide an antifuse device, a method of forming an antifuse device, and a method of operating an antifuse device.

According to one embodiment of the present, an antifuse device is provided. The antifuse device includes a substrate having a plurality of active regions. A plurality of word lines are formed in the substrate and extend along a first direction. Each of the active regions is cut by two adjacent word lines and therefore divided into a first doped region and two second doped regions. A plurality of bit lines are formed on the substrate and extend along a second direction. The first doped region of each of the active regions is connected to one of the bit lines through a bit line contact structure disposed on the first doped region. A plurality of source lines are formed on the substrate and extend along the second direction. The second doped regions of the active regions are respectively connected to one of the source lines through a source line contact structure disposed on each of the second doped regions. A plurality of capacitors are arranged along the second direction and respectively sandwiched between the source line contact structure and one of the bitlines.

According to one embodiment of the present, a method of operating an antifuse device is provided. First, an antifuse device is provided. The antifuse device includes a plurality of word lines, a plurality of bit lines, a plurality of source lines alternately arranged with the bit lines, and a plurality of antifuse cells. The antifuse cells respectively have a gate and a capacitor. The gate has a turn-on voltage and is controlled by one of the word lines. The gate is connected between one of the bit lines and the capacitor. The capacitor has a breakdown voltage and is connected between the gate and one of the source lines. A pair of the antifuse cells having their gates both controlled by an m-word line are respectively connected between an n-source line and an n-bit line and between the n-source line and an (n+1)-bit line. The n-source line is disposed between the n-bit line and the (n+1)-bit line. Subsequently, a word line control signal is provided to the m-word line, a source line control signal is provided to the n-source line, a first bit line control signal is provided to the n-bit line and a second bit line control signal is provided to the (n+1)-bit line to program or read from the pair of the antifuse cells.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 10 are schematic diagrams illustrating the process of forming an antifuse device and a DRAM device on a same substrate according to embodiments of the present invention, in which:

FIG. 2 shows a top view of the antifuse device in the beginning of the process according to one embodiment of the present invention;

FIG. 3 shows cross-sectional views of the antifuse device and the DRAM device at the step as shown in FIG. 2;

FIG. 4 shows cross-sectional views of the antifuse device and the DRAM device after forming a bottom metal layer according to one embodiment of the present invention;

FIG. 5 shows schematic cross-sectional views of the antifuse device and the DRAM device after forming an insulating layer and a top metal layer according to one embodiment of the present invention;

FIG. 6 shows top views of the antifuse device and the DRAM device as shown in FIG. 5;

FIG. 7 and FIG. 8 are cross-sectional views of the antifuse device and the DRAM device after forming a metal layer on the substrate and patterning the metal layer into plural source lines on the region of the antifuse device and plural storage node contact pads on the region of the DRAM device according to one embodiment of the present invention;

FIG. 9 shows top views of the antifuse device and the DRAM device as shown in FIG. 8; and FIG. 10 shows cross-sectional views of the antifuse device and the DRAM device after forming the capacitors on the region of the DRAM device according to one embodiment of the present invention.

FIG. 11 to FIG. 14 are schematic diagrams illustrating the method of operating an antifuse device according to one embodiment of the present invention, in which:

FIG. 11 shows a top view of the antifuse device;

FIG. 12 shows a circuit diagram of the antifuse device;

FIG. 13 shows the voltages applied to the antifuse device when performing a programming operation to the antifuse device; and FIG. 14 shows the voltages applied to the antifuse device when performing a reading operation to the antifuse device.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
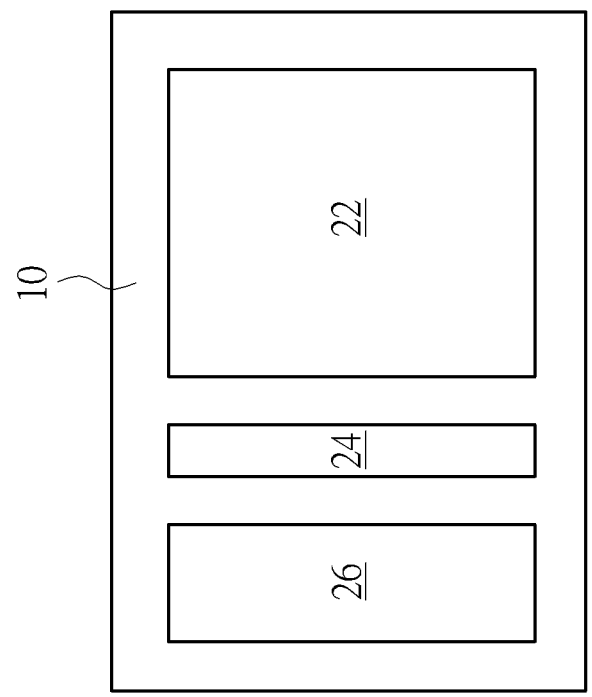
FIG. 1 is a schematic diagram illustrating the arrangement of an antifuse array in a DRAM chip and a circuit diagram of a conventional DRAM-based antifuse device.
Figure 1:
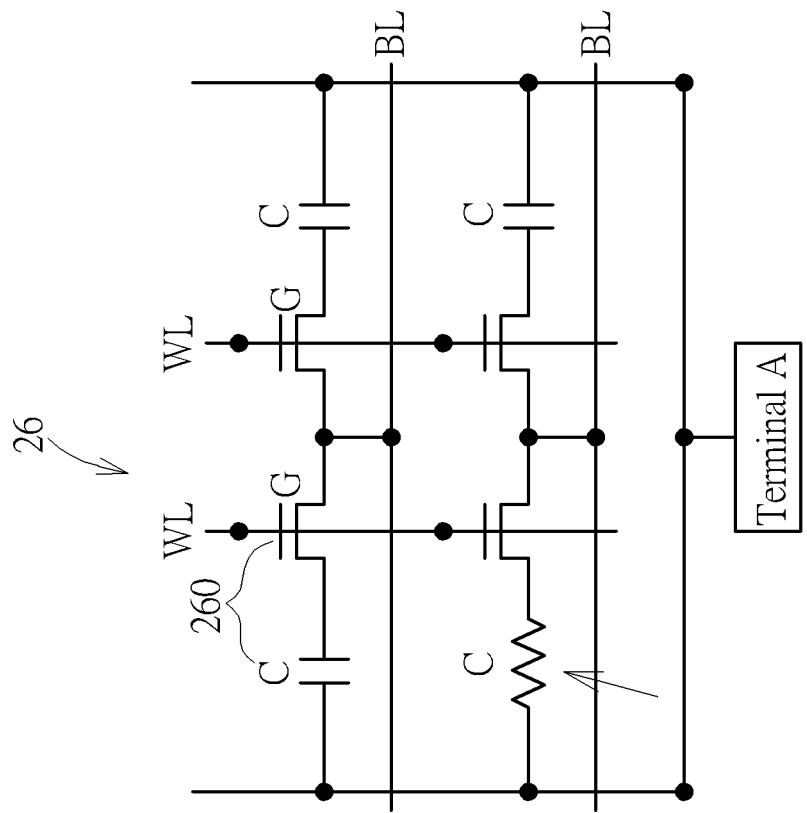
Figure 2:
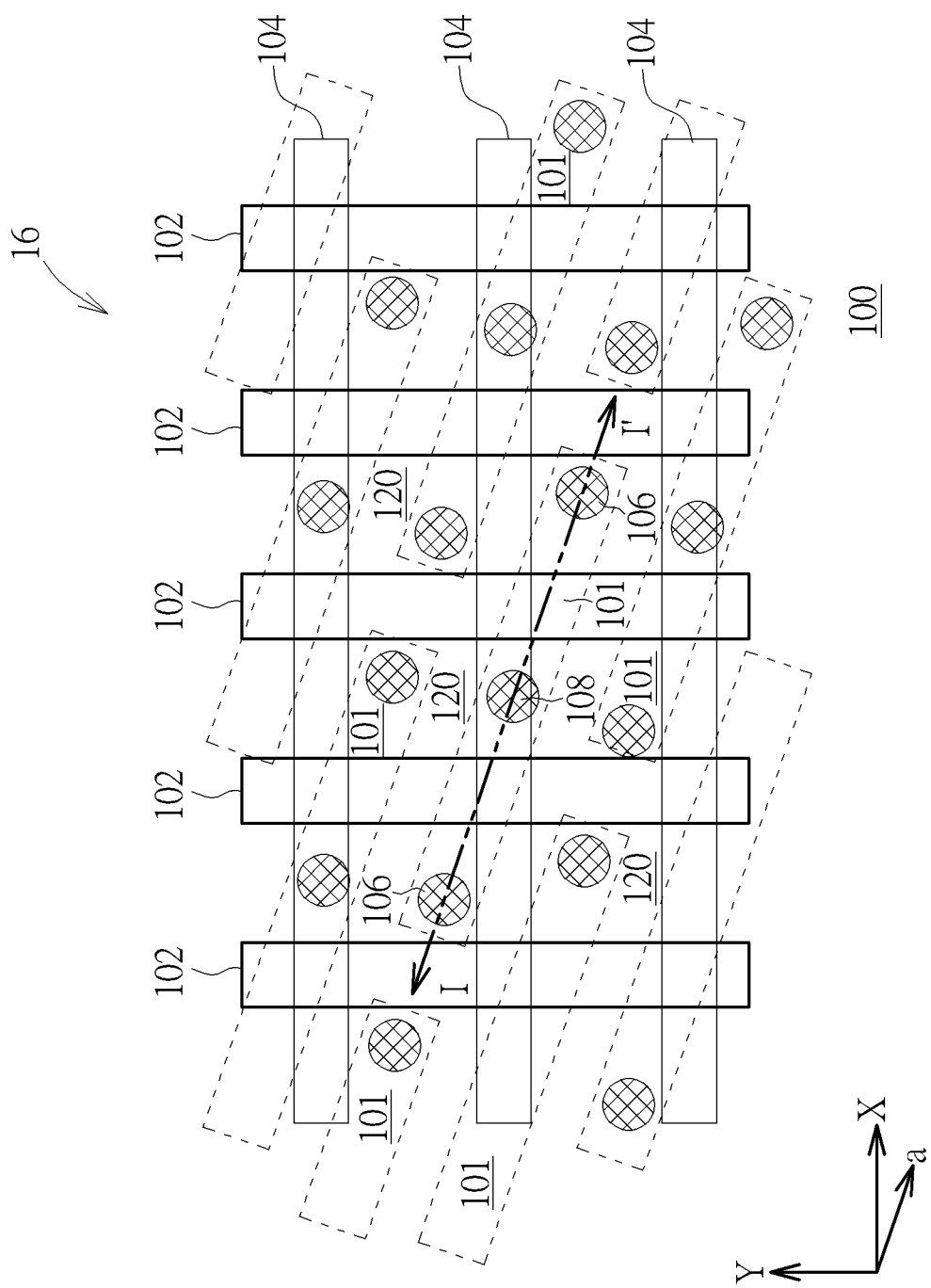
Figure 3:
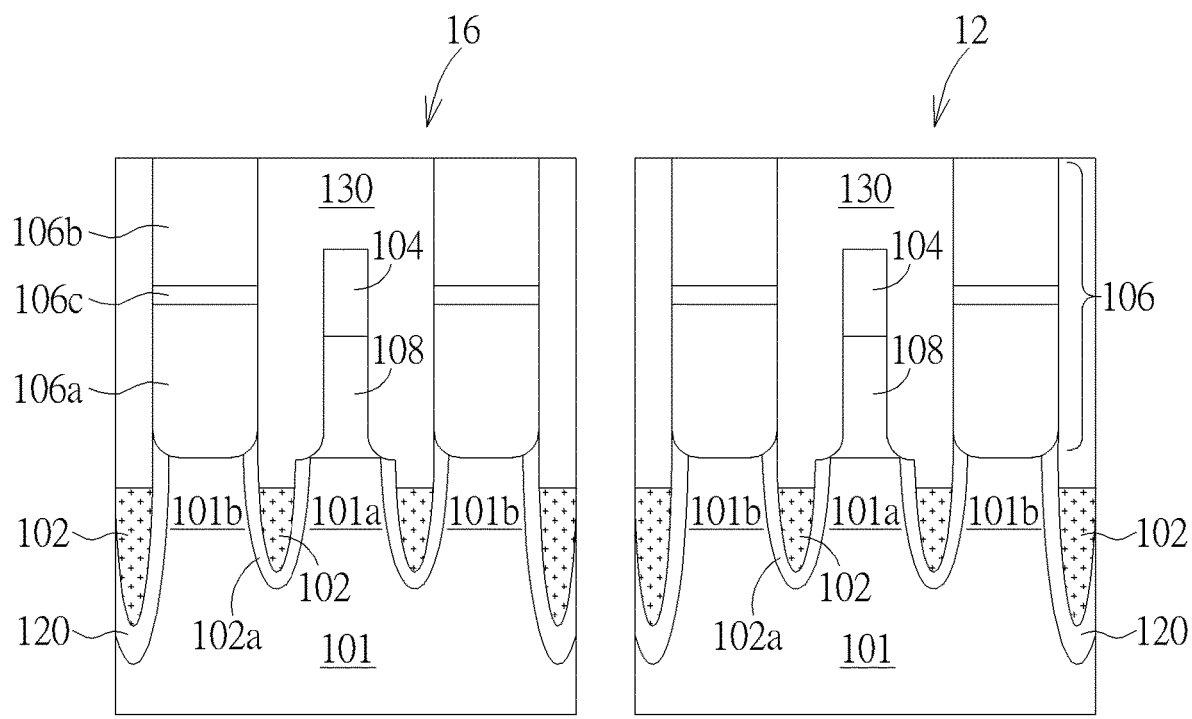

Please refer to FIG. 2 and FIG. 3. FIG. 2 is a schematic top view of the antifuse device 16 after forming the active regions 101, the word lines 102, the bit lines 104 and contact structures 106 and 108 on the substrate 100. FIG. 3 is a schematic cross-sectional view of the antifuse device 16 taken along line I-I' as shown in FIG. 2. The antifuse device 16 has a DRAM-based structure and may be formed integrally with the process of forming a DRAM device 12 on the substrate 100. More specifically, after forming the active regions 101, the word lines 102, the bit lines 104 and the contact structures 106 and 108 on the region of the antifuse device 16 and on the region of the DRAM device 12 through the same process steps, steps for forming the capacitors of the antifuse device 16 are performed before the process of forming the capacitors of the DRAM device 12. The antifuse device 16 and the DRAM device 12 provided by the present invention may have the same active regions 101, word lines 102, bit lines 104 and contact structures 106 and 108. Therefore, at the process stage as shown in FIG. 2, the DRAM device 12 formed on another region of the substrate 100 may have a top view the same as the antifuse device 16. The right portion of FIG. 3 is a cross-sectional view taken along a line the same as line I-I' with respect to the DRAM device 12. The antifuse device 16 and the DRAM device 12 may have the same cell design and feature size. For example, the antifuse device 16 and the DRAM device 12 may have a $6F^2$ cell design.

As shown in FIG. 2, a substrate 100 is provided. The substrate 100 may be a silicon substrate, silicon on insulator (SOI) substrate or an epitaxial substrate, but not limited thereto. An isolation structure 120 such as a shallow isolation structure may be formed in the substrate 100 and defines a plurality of active regions 101 in the substrate 100. A plurality of word lines 102 are formed in the substrate 100, extend longitudinally along a first direction Y and cut through the active regions 101 and the isolation structure 120. A plurality of bit lines 104 are formed on the substrate 100, extend longitudinally along a second direction X that is perpendicular to the first direction Y and stride across the active regions 101 and the isolation structure 120. The active regions 101 may extend along a third direction a, and are arranged end-to-end along the third direction a. The first direction Y and the third direction a may have an enclosed angle smaller than 90 degrees. Each of the active regions 101 is cut into three regions, including a first doped region 101a and two second doped regions 101b at two sides of the first doped region 101a, by two neighboring word lines 102. The portions of the active regions 101 cut by the word lines 102 are the trench gates. The bit lines 104 stride across the first doped regions 101a of the active regions 101. A contact structure 108 is formed on the first active region 101a of each active region 101 to connect the first active region 101a to one of the bit lines 104. A contact structure 106 is formed on each second doped region 101b of each active region 101b to connect the second doped region 101b to a capacitor to be formed in the following process. More specifically, each second doped region 101b of the antifuse device 16 may be connected to an antifuse capacitor (shown in FIG. 8), while each second doped region 101b of the DRAM device 12 may be connected to a memory capacitor (shown in FIG. 10). According to an embodiment, the contact structures 106 may have a stacked structure including a conductive layer 106a made of a nonmetallic conductive material, a conductive layer 106b made of a metallic conductive material and a metal silicide layer 106c between the conductive layer 106a and the conductive layer 106b. Foe example, the conductive layer 106a may be made of doped polysilicon, the conductive layer 106b may be made of tungsten, and the silicide layer 106c may be made of cobalt silicide, but not limited thereto. The shapes of the contact structures 106 and the contact structures 108 shown in FIG. 2 are only for illustrating their placements in the antifuse device 16 (or in the DRAM device 12) and should not be a limitation of the scope of the present invention.

The word lines 102 may be formed by the following process. According to an embodiment, after forming the isolation structure 120 in the substrate 100 and the planarization process of the substrate 100, a patterning process, such as a photo-lithography process may be performed to form a plurality of word line trenches in the substrate 100. Afterward, a gate dielectric layer 102a is formed conformally covering the surfaces of each word line trench and a metal material is then formed on the dielectric layer 102a and completely fills each word line trench. After removing the excess metal material outside these word line trenches, the metal material remaining within each the word line trench is further recessed to a depth below the surface of the substrate 100, thereby obtaining a word lines 102 formed along and partially filling each word line trench.

According to an embodiment, the material forming the contact structures 108 and the bit lines 104 may be patterned by the same patterning process. Therefore, the contact structures 108 along a same bit line 104 may form a continuous structure extending along the bit line 104. According to an embodiment, the contact structures 106 may be formed self-aligned in the spaces between two adjacent bit lines 104. After forming the contact structures 106 and contact structures 108, as shown in FIG. 3, a dielectric layer 130 may be deposited to fill the spaces between the contact structures 106 and the contact structures 108 to provide a planar top surface 16a on the region of the antifuse device 16 and a top surface 12a on the region of the DRAM device for performing subsequent processing. As shown in FIG. 3, both the conductive layers 106b of the antifuse device 16 and the conductive layers 106b of the DRAM device 12 are respectively exposed from the top surface 16a and the top surface 12a for further connecting.

Figure 4:
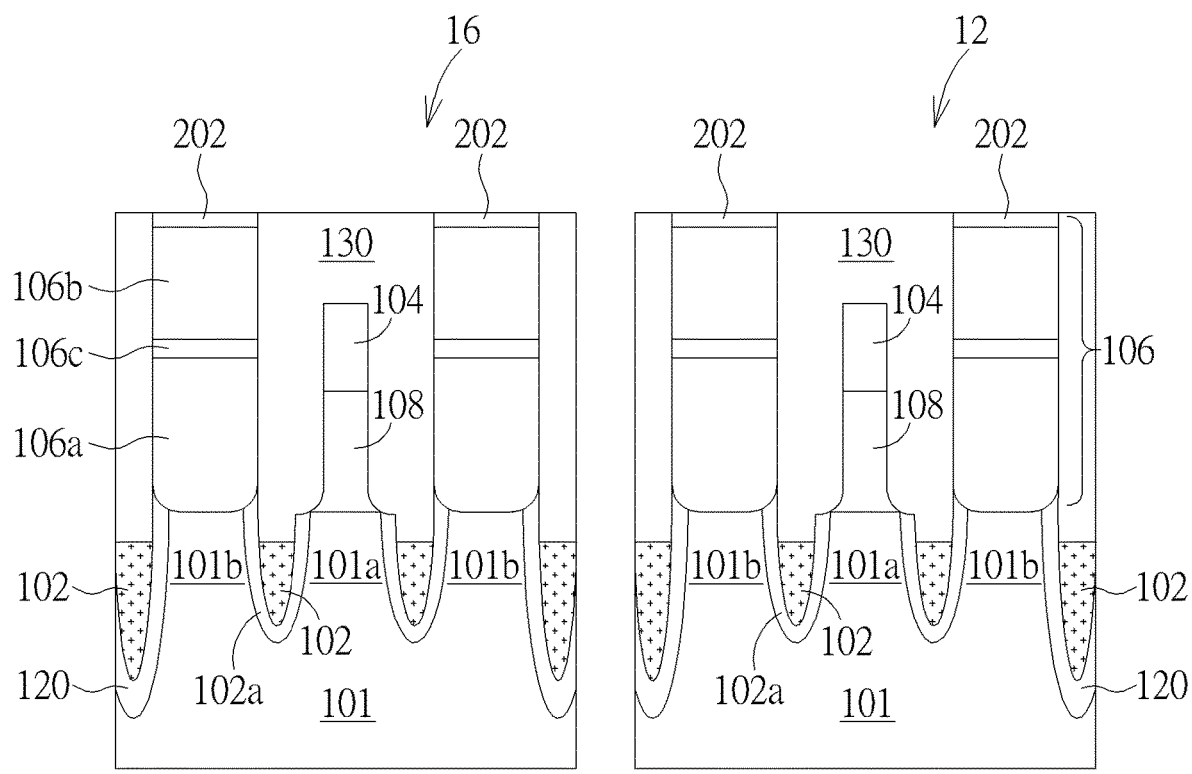

Please refer to FIG. 4. FIG. 4 shows cross-sectional views of the antifuse device and the DRAM device after forming a bottom metal layer according to one embodiment of the present invention. After obtaining the top surfaces 16a and 12a as shown in FIG. 3, subsequently, an etching back process is performed to recess the conductive layer 160b of the antifuse device 16 and the conductive layer 106b of the DRAM device to a level below the top surface of the dielectric layer 130, respectively. Afterward, a bottom metal layer 202 is formed on the substrate 100 in a blanket manner and conformally covers the region of the antifuse device 16 and the region of the DRAM device 12 to fill up the recesses. The bottom metal layer 202 may be a titanium nitride layer and may be formed by an atomic layer deposition (ALD) process, for example. The excess bottom metal layer 202 outside the recesses is then removed by a chemical mechanical process or an etching back process. According to an embodiment, the recessed depth of the conductive layer 160b may be smaller than 4 nm, and the bottom metal layer 202 as deposited preferable has a thickness between 6 nm and 10 nm. After the excess bottom metal layer 202 outside the recesses is removed, the bottom metal layer 202 remaining in the recesses preferable has a thickness between 2 nm and 4 nm. As shown in FIG. 4, the bottom metal layer 202 completely covers a top surface of the conductive layer 160b of the contact structure 106 and the sidewalls completely aligned.

Figure 5:
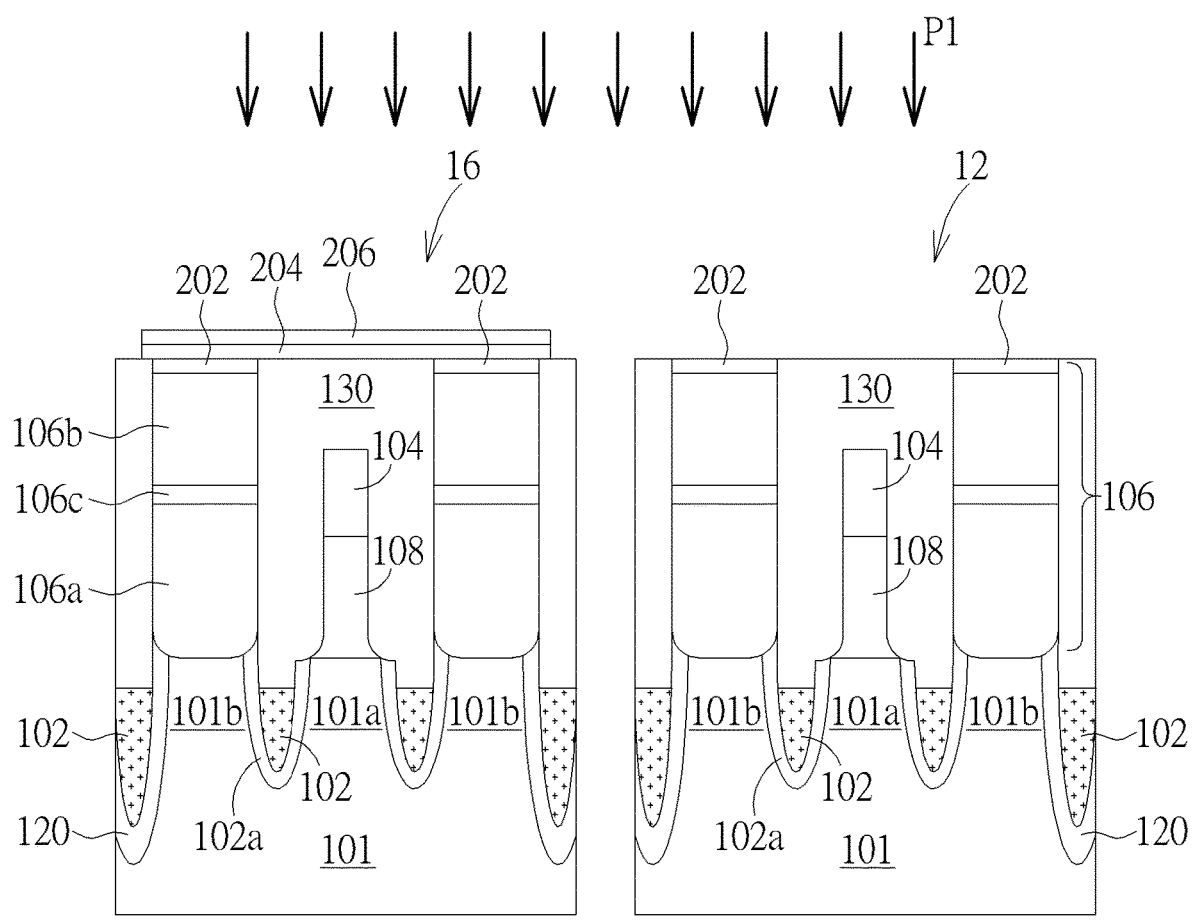
Figure 6:
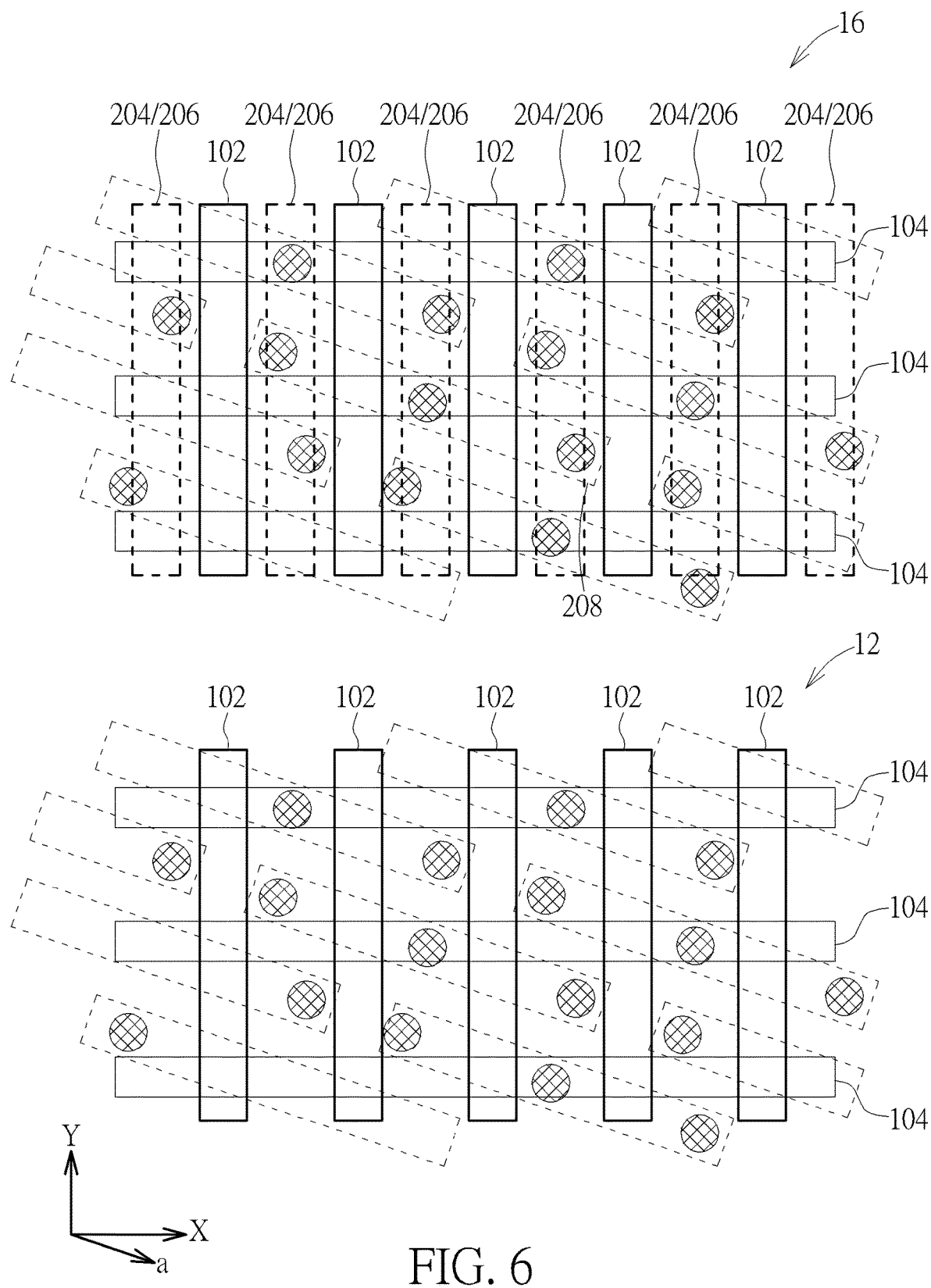

Please refer to FIG. 5 and FIG. 6. FIG. 5 shows schematic cross-sectional views of the antifuse device and the DRAM device after forming an insulating layer and a top metal layer on the region of the antifuse device according to one embodiment of the present invention. FIG. 6 shows top views of the antifuse device and the DRAM device as shown in FIG. 5. After forming the bottom metal layer 202 as shown in FIG. 4, subsequently, an insulating layer 204 and a top metal layer 206 are successively formed on the substrate 100 in a blanket manner and completely cover the region of the antifuse device 16 and the region of the DRAM device 12. A first patterning process P1, such as a photolithography-etching process is then performed to pattern the insulating layer 204 and the top metal layer 206 on the region of the antifuse device 16 into a plurality of line-shaped structures (see FIG. 6) and also remove the insulating layer 204 and the top metal layer 206 on the region of the DRAM device 12 to expose the bottom metal layer 202 of the DRAM device 12. Please refer to the upper portion of FIG. 6. The line-shaped structures of the patterned insulating layer 204 and the top metal layer 206 on the region of the antifuse device 16 extend along the first direction Y and are alternately arranged with the word lines 102 from the top view. The second doped regions 101b and the contact structures 106 of the antifuse device 16 are vertically overlapped by the line-shaped structures of the patterned insulating layer 204 and the top metal layer 206. Please refer to the lower portion of FIG. 6. The insulating layer 204 and the top metal layer 206 on the region of the DRAM device 12 are completely removed.

Figure 7:
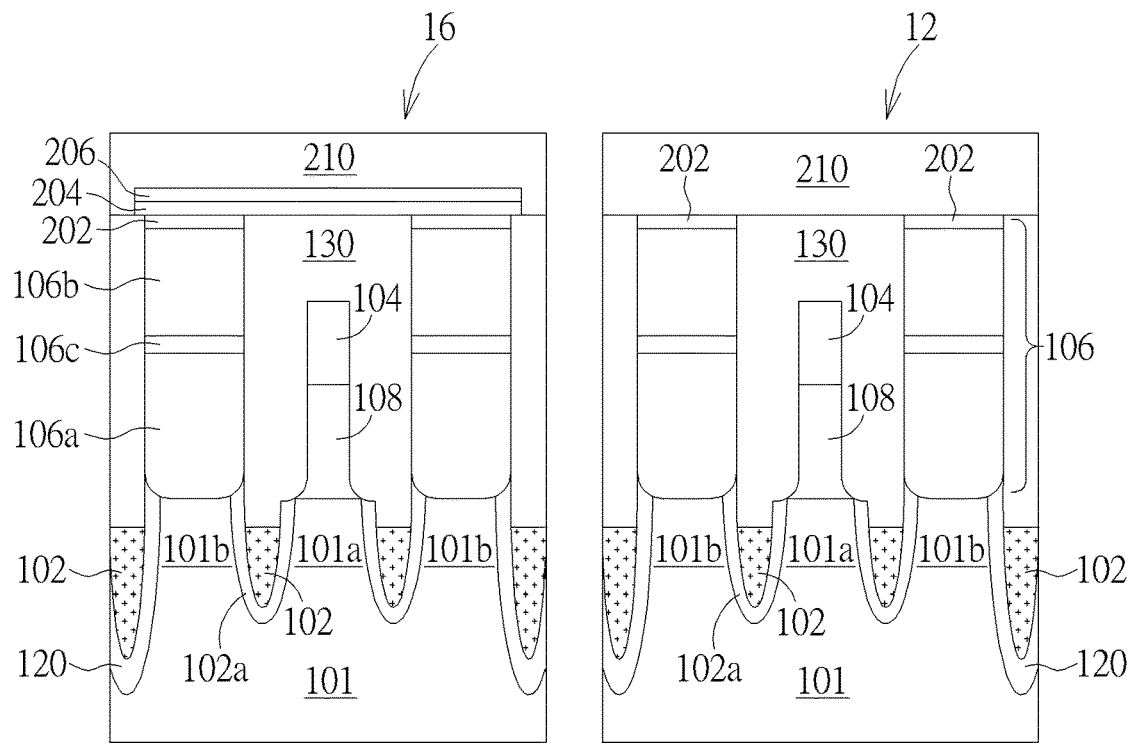
Figure 8:
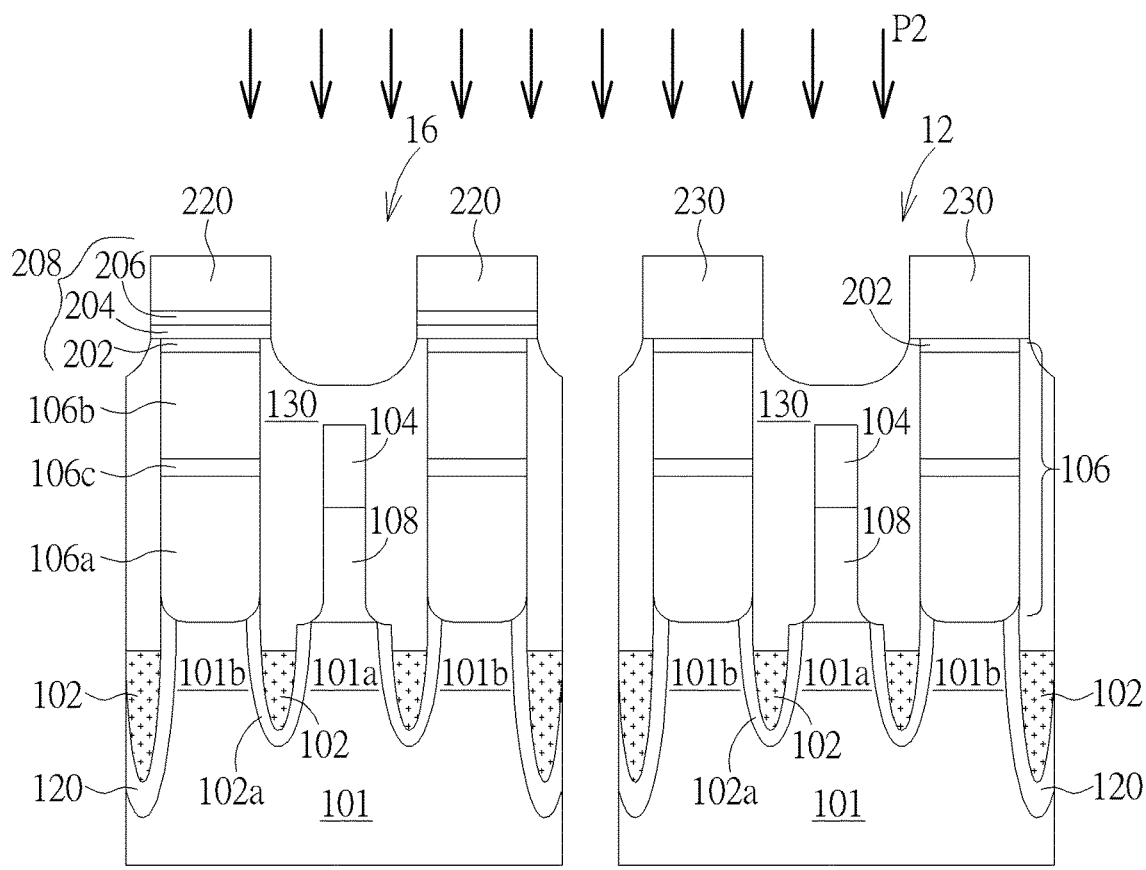
Figure 9:
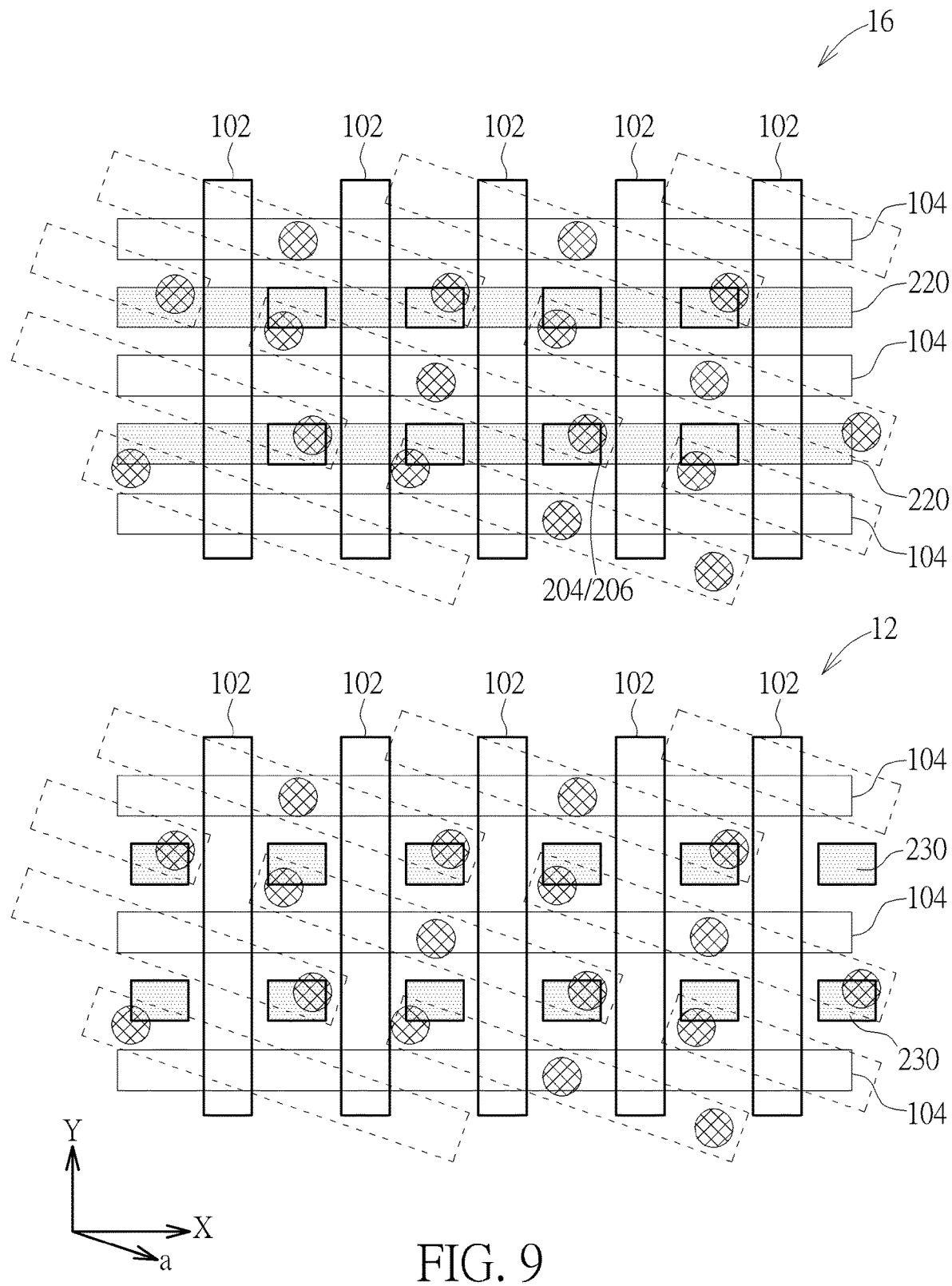

Please refer to FIG. 7, FIG. 8 and FIG. 9. FIG. 7 and FIG. 8 are cross-sectional views of the antifuse device and the DRAM device after forming a metal layer and patterning the metal layer into plural source lines on the region of the antifuse device and plural storage node contact pads on the region of the DRAM device according to one embodiment of the present invention. FIG. 9 shows top views of the antifuse device and the DRAM device at the step as shown in FIG. 8. As shown in FIG. 7, a metal layer 210 is then formed on the substrate 100 in a blanket manner and completely covers the region of the antifuse device 16 and the region of the DRAM device 12. According to an embodiment, the metal layer 210 may be made of tungsten, but not limited thereto. Subsequently, as shown in FIG. 8 and FIG. 9, a second patterning process P2, such as a photolithography-etching process is performed to pattern the metal layer 210 on the region of the antifuse device 16 into a plurality of source lines 220 and further pattern the line-shaped structures of the insulating layer 204 and top metal layer 206 shown in FIG. 6 into a plurality island-shaped structures. The metal layer 210 on the region of the DRAM device 12 is also patterned into a plurality of storage node contact pads 230 by the second patterning process P2. Please refer to the upper portion of FIG. 9. The source lines 220 extend along the second direction X and are arranged alternately with the bit lines 104 from the top view. The second doped regions 101b, the contact structures 106 and the island-shaped structures of the insulating layer 204 and top metal layer 206 between a pair of adjacent bit lines 104 are overlapped by a same source line 220. The second doped regions 101b between the pair of bit lines 104 are therefore being electrically connected to a same source line 220. The second doped regions 101b between different pairs of bit lines 104 are electrically connected to different source lines 220. Please refer to the lower portion of FIG. 9. The storage node contact pads 230 are island-shaped and are respectively disposed on each of the second doped regions 101b of the active regions 101 of the DRAM device 12.

According to an embodiment, preferably, the second patterning process P2 is a multiple patterning process that includes two or more successive photolithography-etching process to define the shape of the source lines and the shape of the capacitor contact pads 230. According to an embodiment, the second patterning process P2 may include a first photolithography-etching process to pattern the metal layer 210 on the region of the antifuse device 16 and the metal layer 210 on region of the DRAM device 12 respectively into a plurality of continuous linear structures that extend along the second direction X. The second patterning process P2 may further include a second photolithography-etching process to pattern the continuous linear structures of the metal layer 210 on the region of the DRAM device 12 into a plurality of isolated capacitor contacting pads 230 that are respectively disposed on one of the contact structures 106. It is noteworthy that, the line-shaped structures of the insulating layer 204 and top metal layer 206 shown in FIG. 6 and the metal layer 210 on the region of the antifuse device 16 are only patterned by the first photolithography-etching process of the second patterned process P2 and are not patterned by the second photolithography-etching process by being covered by a masking layer such as a photoresist layer or a hard mask layer. Because that the top metal layer 206 and the insulating layer 204 on the region of the antifuse region 16 are always patterned together by the first patterning process P1 and by the second patterning process P2, the top metal layer 206 and the insulating layer 204 of each island-shaped structures as shown in FIG. 8 and the upper portion of FIG. 9 are completely overlapped with each other and have completely aligned sidewalls, among which a first sidewall of the top metal layer 206 and the insulating layer 204 may be flush with a lengthwise sidewall of the source line 220 disposed thereupon, and a second sidewall may be completely cover by the source lines 220.

Please still refer to FIG. 8 and FIG. 9. The top metal layer 206 and the insulating layer 204 may overlap at least a portion of the contact structures 106 and directly contact the bottom metal layer 202 on the contact structures 106. The dimension of the top metal layer 206 and the insulating layer 204 along the second direction X may be controlled by the first patterning process P1 illustrated in FIG. 5. The dimension of the top metal layer 206 and the insulating layer 204 along the first direction Y may be controlled by the second patterning process P2 illustrated in FIG. 8. According to an embodiment, the top metal layer 206 and the insulating layer 204 preferably have areas larger than that of the bottom metal layer 202 disposed thereunder.

Please still refer to FIG. 8. The bottom metal layer 202, the top metal layer 206 and the insulating layer 204 sandwiched between the bottom metal layer 202 and the top metal layer 206 form an antifuse capacitor 208 that is electrically connected between the source line 220 and the second doped region 101b of the active region 101 through the contact structure 106. According to the present invention, the antifuse capacitor 208 and the trench gate adjacent to the second doped region 101b connected with the antifuse capacitor 208 are configured into an antifuse cell. The voltage applied across the antifuse capacitor 208 may be controlled by the source line 220 and the bit line 104 and the word line 102 connected to the trench gate. An un-programmed antifuse cell may refer to the antifuse capacitor 208 thereof having the bottom metal layer 202 and the top metal layer 206 electrically insulated from each other by the insulating layer 204. No current may be conducted between the bottom metal layer 202 and the top metal layer 206 and the antifuse cell may be considered as "off" state or "0". An antifuse cell may be programmed by applying a voltage across the antifuse capacitor 208 that is large enough to break down the insulating layer 204 and allow current being conducted between the bottom metal layer 202 and the top metal layer 206. The antifuse cell may be considered as "on" state or "1".

Figure 10:
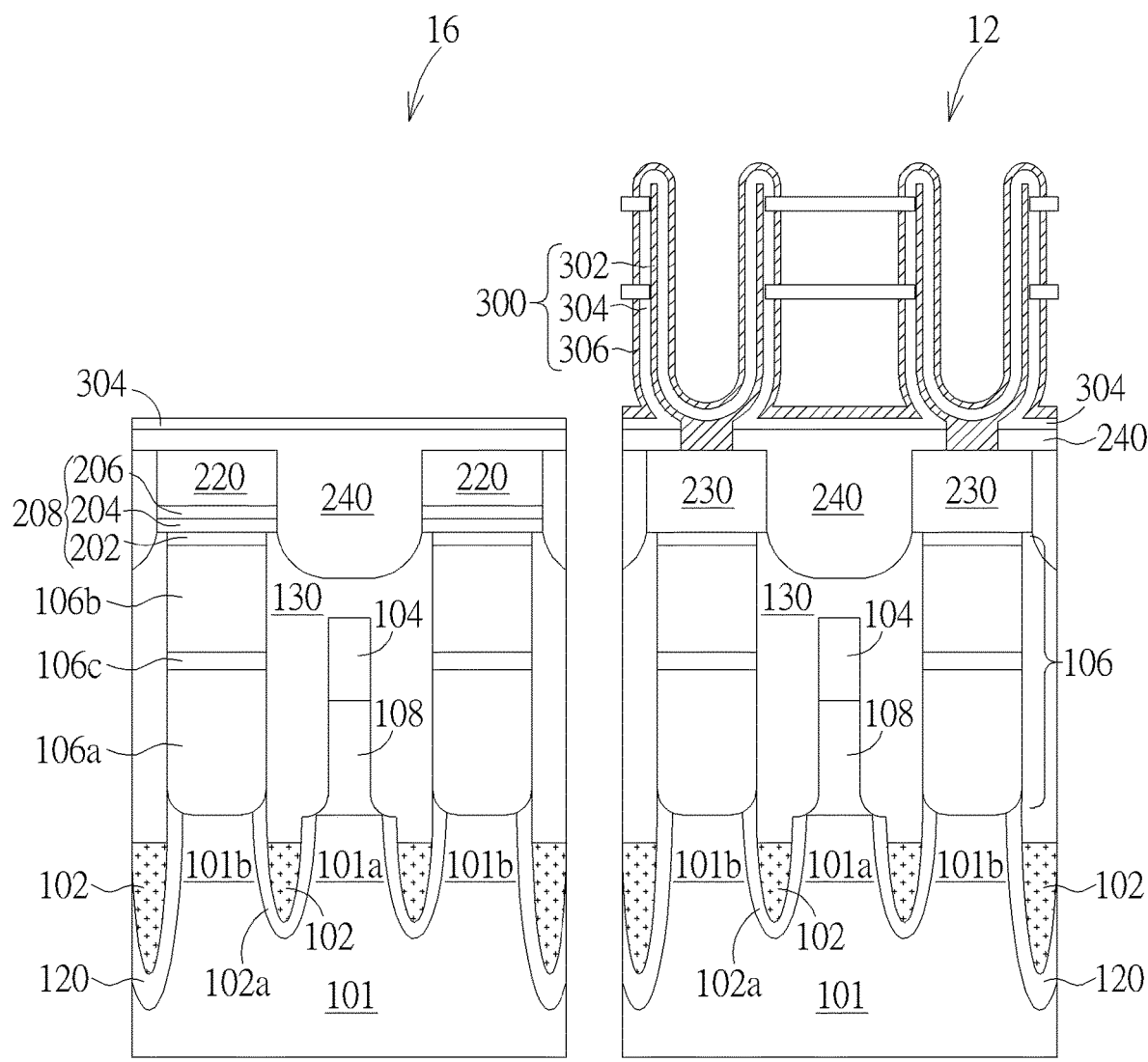

Please refer to FIG. 10, which shows the cross-sectional views of the antifuse device and the DRAM device after forming the memory capacitors on the region of the DRAM device according to one embodiment of the present invention. After forming the source lines 220 and the storage node contact pads 230, subsequently, a dielectric layer 240 is formed on the substrate 100 in a blanket manner, completely covering the region of the antifuse device 16 and the region of the DRAM device 12 and filling up the recesses between the source lines 220 and between the storage node contact pads 230. According to an embodiment, the dielectric layer 240 may comprise silicon oxide or silicon nitride, but not limited thereto. A planarization process may be performed to planarize the dielectric layer 240 thereby obtaining a planar top surface of the dielectric layer 240 for performing the subsequent processes. After that, the memory capacitors 300 may be formed on the region of the DRAM device 12. According to an embodiment, the memory capacitors 300 may be conventional crown-type capacitors or other types of capacitors formed by well-known processes. The memory capacitors 300 are disposed on the storage node contact pads 230, respectively. Each of the memory capacitors 300 includes a bottom metal layer 302, a top metal layer 306 and an insulating layer 304 sandwiched between the bottom metal layer 302 and the top metal layer 306. The bottom metal layer 302 and the top metal layer 306 may include titanium nitride and the insulating layer 304 may include high-k dielectric material, for example. As shown in the right portion of FIG. 10, the bottom metal layer 302 of each memory capacitor 300 has a U-shaped cross-sectional profile and is electrically connected to a capacitor contact pad 230. The insulating layer 304 and the top metal layer 306 successively and conformally cover the bottom metal layers 302. Therefore, the memory capacitors 300 formed on the region of the DRAM device 12 substantially have their top electrode (the top metal layer 306) electrically connected. According to an embodiment, as shown in the left portion of FIG. 10, the insulating layer 304 may also cover the region of the antifuse device 16. It is noteworthy that the memory capacitors 300 and the antifuse capacitors 208 have different horizontal levels with respect to the surface of the substrate 100 on which they are formed. The memory capacitors 300 are at a horizontal level higher than the antifuse capacitors 208.

Figure 11:
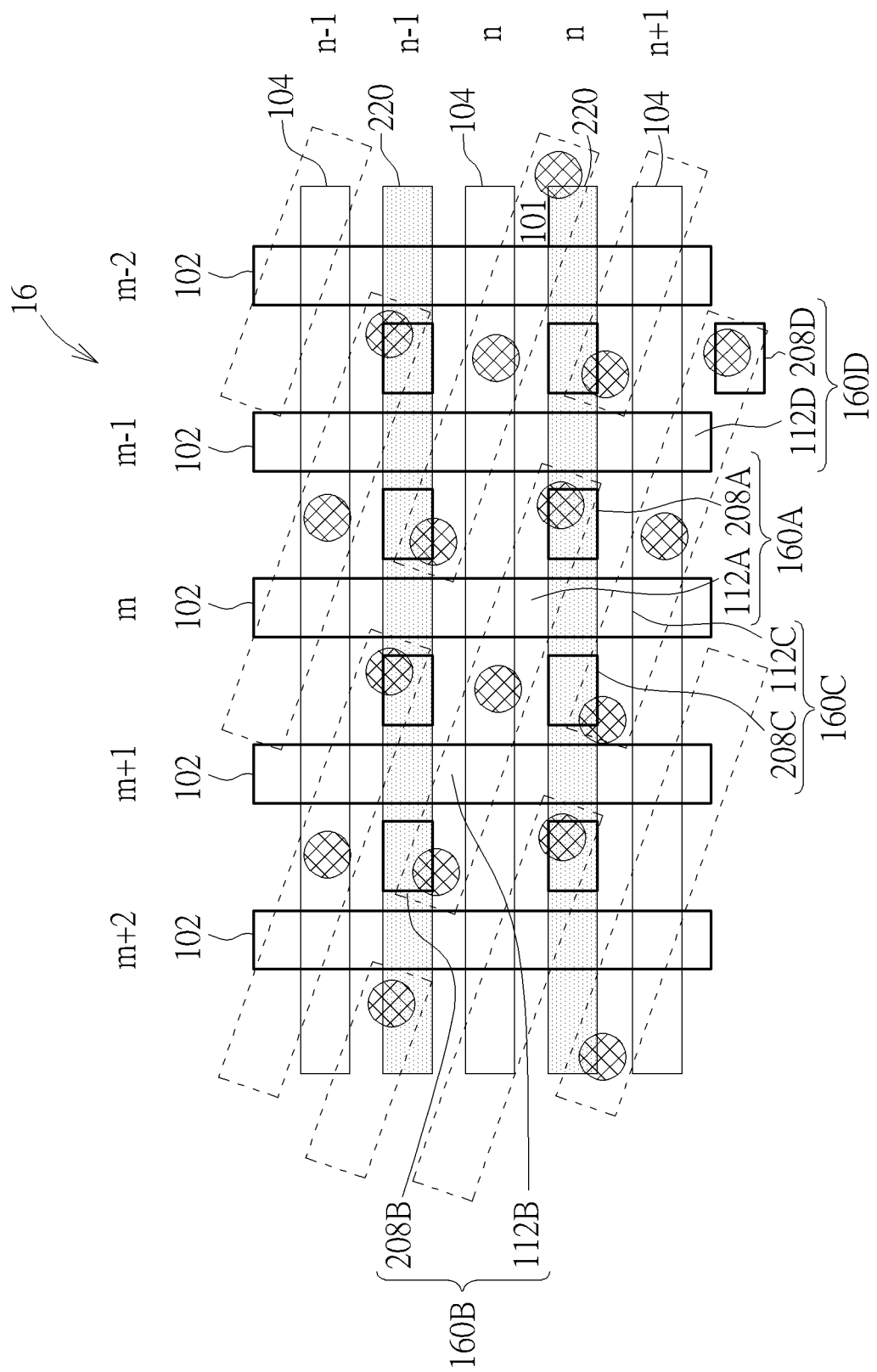
Figure 12:
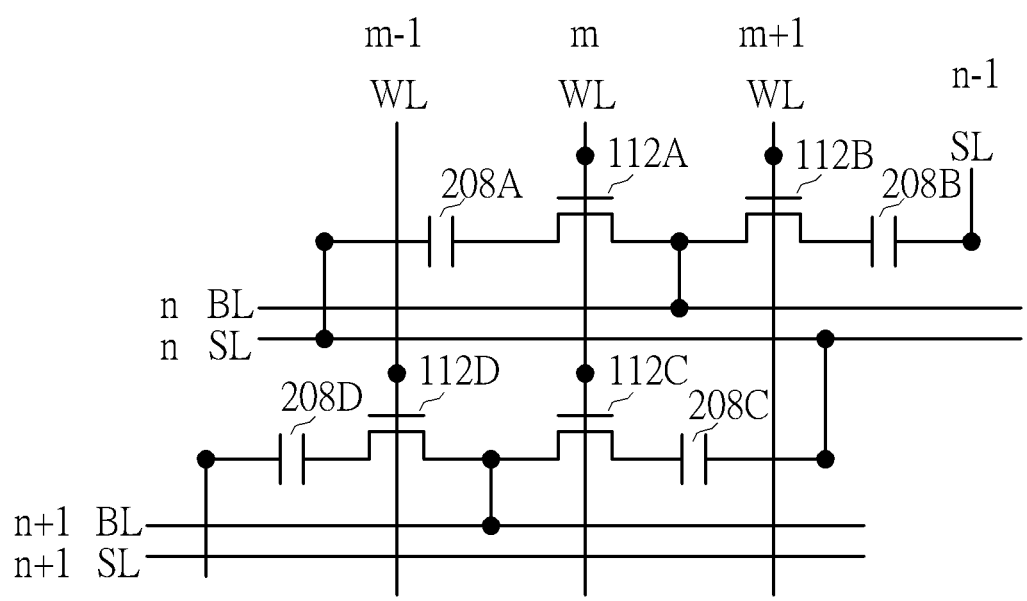
Figure 13:
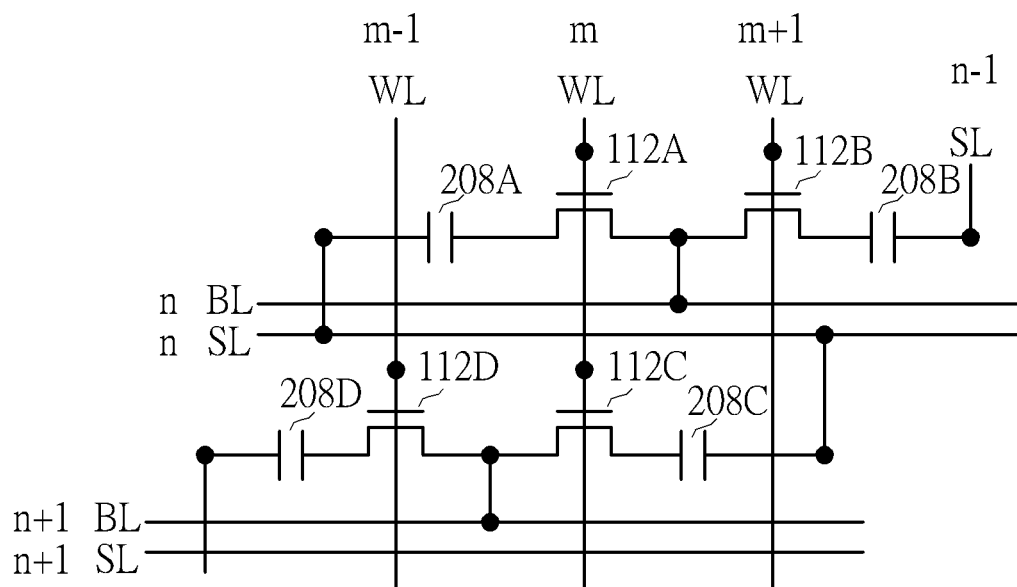
Figure 14:
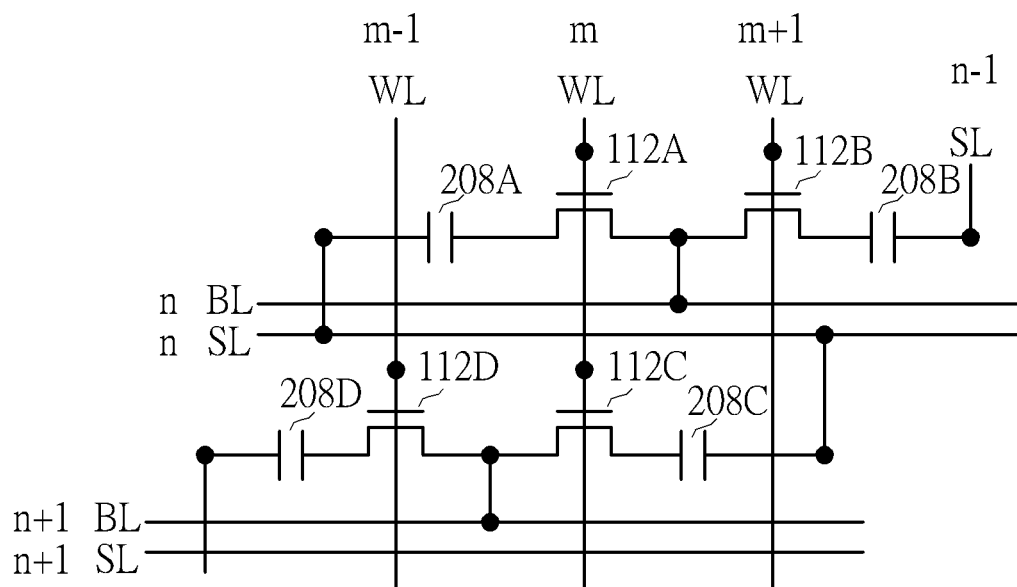

FIG. 11 to FIG. 14 are schematic diagrams illustrating the method of operating an antifuse device according to one embodiment of the present invention. FIG. 11 illustrates a top view of the antifuse device. FIG. 12 illustrates a circuit diagram of the antifuse device as shown in FIG. 11. FIG. 13 and FIG. 14 respectively illustrate the method of programming a data into or reading a data from a selected antifuse cell of the antifuse according to one embodiment of the present invention. It should be realized that the top view shown in FIG. 11 and circuit diagram shown in FIG. 12 only represent a portion of the antifuse device and should not be a limitation of the scope of the present invention.

Please refer to FIG. 11 and FIG. 12. An antifuse device 16 is provided. As previously illustrated, the antifuse 16 include a substrate 100, a plurality of active regions 101 defined on the substrate 100, a plurality of word lines 102, a plurality of bit lines 104, a plurality of source lines 220 and a plurality of antifuse capacitors 208. The designations of m+2, m+1, m, m−1, m−2 of the word lines 102 and the designations of n+1, n, n−1 of the bit lines 104 and the source lines 220 shown in FIG. 11 and FIG. 12 are for illustrating the serial orders and do not have numerical meanings. The numbers m and n are integers. The n-source line 220 is between the n-bit line 104 and the (n+1)-bit line 104. The word lines 102 are formed in the substrate 100 and extend along the first direction Y. Each active region 101 is cut by two neighboring word lines 102 thereby being divided into a first doped region 101a and two second doped region 101b at two sides of the first doped region 101a. The bit lines 104 extend along the second direction X and stride across the first doped regions 101a of the active regions 101. Each of the first doped regions 101a is electrically connected to one of the bit lines 104 through a contact structure 108 disposed on the first doped regions 101a. The source lines 220 extend along the second direction X and stride across the second doped regions 101b. The source lines 202 are alternately arranged with the bit lines 104. The antifuse capacitors 208 are arranged along the source lines 220 and respectively disposed between the source lines 220 and a contact structure 106 disposed on each of the second doped regions 101b. Each antifuse capacitor 208 has a metal-insulator-insulator (MIM) structure, among which the top metal layer is electrically connected to the source line 220 that overlaps on the top metal layer and the bottom metal layer is electrically connected to the second doped region 101b by the contact structure 106 overlapped by the bottom metal layer. The region of the active region 101 cut by a word line 102 forms a trench-type gate 112. The gate 112 and the antifuse capacitor 208 connected to the second doped region 101b at one side of the gate 112 are configured into an antifuse cell 160.

For the sake of illustration, a group of four locationally and electronically associated antifuse cells 160A, 160B, 160C, 160D are designated in FIG. 11 and the corresponding circuit diagram are shown in FIG. 12. The antifuse cell 160A includes the antifuse capacitor 208A and the gate 112A. The antifuse cell 160B includes the antifuse capacitor 208B and the gate 112B. The antifuse cell 160C includes the antifuse capacitor 208C and the gate 112C. The antifuse cell 160AD includes the antifuse capacitor 208D and the gate 112D. More specifically, the gates 112A and 112B are formed in the same active region 101 and have a common terminal (the first doped region 101a of the active region 101) coupled to the n-bit line 104. The other side of the gate 112A is coupled to the n-source line through the antifuse capacitor 208A. The other side of the gate 112B is coupled to the (n−1)-source line through the antifuse capacitor 208B. The gates 112 C and 112D are formed in the same active region 101 and have a common terminal coupled to the (n+1)-bit line 104. The other side of the gate 112C is connected to the n-source line through the antifuse capacitor 208C. The other side of the gate 112D is connected to the (n+1)-source line through the antifuse capacitor 208D. The gates 112A and 112C are controlled by the m-word line 102. The gate 112B is controlled by the (m+1)-word line 102. The gate 112D is controlled by the (m−1)-word line 102. The antifuse cell 160A and the antifuse cell 160C are respectively connected between the n-source line 220 and the n-bit line 104 and between the n-source line 220 and the (n+1)-bit line 104.

When operating the antifuse device 16, each column of the word line 102 may be provided with a word line control signal. Each row of the bit lines 104 may be provided with a bit line control signal. Each row of the source lines 220 may be provided with a source line control signal. An antifuse cell 160 of the antifuse device 16 may be addressed for being programmed or read from by activating a column of the word lines 102, a row of the bit lines 104 and a row of the source line 220 associated with the antifuse cell 160.

Please refer to FIG. 13. The upper portion of FIG. 13 depicts the signals applied to the word lines, bit lines and source lines respectively associated with the antifuse cells 160A, 160B, 160C and 160D when the antifuse cell 160A is to be programmed according to one embodiment of the present invention. The lower portion of FIG. 13 reproduces the circuit diagram as shown in FIG. 12. A word line control signal applied to the m-word line (m WL) that controls the gates of the antifuse cells 160A and 160C may be a first voltage larger than the turn-on voltage of the gates 112A. For example, the first voltage may be around 2.5 V. A source line control signal applied to the n-source line (n SL) that is connected to the antifuse capacitors 208A and 208C may be a second voltage. A first bit line control signal applied to the n-bit line (n BL) that is connected to the common terminal of the gates 112A and 112B may be a third voltage. According to an embodiment, the second voltage is larger than the third voltage by a difference larger than the breakdown voltage of the antifuse capacitor 208A of the antifuse cell 160. For example, when the breakdown voltage of the antifuse capacitor 208A is around 3V, the second voltage may range from 2.5V to 3.6V, and the third voltage may be around −0.7V. Therefore, when the gate 112A is turned on, the difference between the second voltage and the third voltage (3.2V to 4.3V) may be applied across the antifuse capacitor 208A such that the antifuse capacitor 208A is broken down and current may conduct between the n BL and the n SL connected at two sides of the antifuse cell 160A. A bit of data is therefore been programmed into the antifuse cell 160A and the antifuse cell 160A may be read as "on". It is noteworthy that when programming the antifuse cell 160A, the gate 112C of the antifuse cell 160C is also turned on by the m WL. To prevent the unexpected break down of the antifuse capacitor 208C of the antifuse cell 160C or reduce leakage current from the n SL to the (n+1)-bit line (n+1 BL) through a programmed antifuse capacitor 208C (equivalent to a conductive resistor with respect to the circuit), a second bit line control signal applied to the n+1 BL may be a fourth voltage that is smaller than the second voltage by a difference smaller than the breakdown voltage of the antifuse capacitor 208C. For example, the fourth voltage may be around 1.2V. In this way, when the gate 112C is turned on by the m WL, the voltage applied across the antifuse capacitor 208C (the difference between the second voltage and the fourth voltage, around 1.3V to 2.4V) is smaller than the breakdown of the antifuse capacitor 208C, and therefore the unexpected breakdown of the antifuse capacitor 208C may be prevented. On the other hand, when the antifuse cell 160C is already programmed when programming the antifuse cell 160A, providing the fourth voltage of 1.2V rather than 0V to the n+1 BL may reduce the leakage current from the n SL to the n+1 BL, and therefore the programming efficiency may be improved. Please still refer to FIG. 13. According to an embodiment when programming the antifuse cell 160A as previously illustrated, a word line control signal provided to the (m+1)-word line controlling the gate 112B may be around −0.3V. A word line control signal provided to the (m−1)-word line controlling the gate 112D may be around −0.3V. A source line control signal applied to the (n−1)-source line connected to the antifuse capacitor 208B and a source line control signal applied to the (n+1)-source line connected to the antifuse capacitor 208D may be 0V. Furthermore, a voltage of around −0.7V may be applied to the substrate 100 of the antifuse device 16.

According to another embodiment, on the other hand, when the antifuse cell 160C is to be programmed, the word line control signal applied to the m WL may be a first voltage around 2.5V, the source line control signal applied to the n SL may be a second voltage ranging from 2.5V to 3.6V, the first bit line control signal applied to the b BL may be a third voltage around 1.2V and the second bit line control signal applied to the n+1 BL may be a fourth voltage around −0.7V. When the gate 112C of the antifuse cell 160C is turned on, a voltage (difference between the second voltage and the fourth voltage, about 3.2V to 4.3V) larger than the breakdown voltage (about 3V) of the antifuse capacitor 208C may be applied across the antifuse capacitor 208C to break down the antifuse capacitor 208C thereby programming a bit of data into the antifuse cell 160C. The difference between the second voltage and the third voltage (around 1.3V to 2.4V) is smaller than the breakdown voltage (about 3V) of the antifuse capacitor 208A of the antifuse cell 160A to prevent unexpected programming of the antifuse cell 160A or current leakage from the n SL to the n BL when the antifuse cell 160A is already being programmed. Similarly, a word line control signal provided to the m+1 WL may be around −0.3V. A word line control signal provided to the m−1 WL may be around −0.3V. A source line control signal applied to the n−1 SL and a source line control signal applied to the n+1 SL may be 0V. A voltage of around −0.7V may be applied to the substrate 100.

Please refer to FIG. 14. The upper portion of FIG. 14 depicts the signals applied to the word lines, bit lines and source lines respectively associated with the antifuse cells 160A, 160B, 160C and 160D when the antifuse cell 160A is to be read from according to one embodiment of the present invention. The lower portion of FIG. 14 reproduces the circuit diagram as shown in FIG. 12. When reading data from the antifuse cell 160A, a word line control signal applied to the m WL that controls the gates of the antifuse cells 160A and 160C may be a first voltage larger than the turn-on voltage of the gates 112A. For example, the first voltage may be around 2.5 V. A source line control signal applied to the n SL that is connected to the antifuse capacitors 208A and 208C may be a second voltage. For example, the second voltage may be around 1.2V. A first bit line control signal applied to the n BL that is connected to the common terminal of the gates 112A and 112B may be a reading signal. When the antifuse cell 160A has been programmed (the antifuse capacitor 208A is broken down and become conductive), the first bit line control signal may detect a current from the n SL and the antifuse cell 160A is read as "on". On the other hand, when the antifuse cell 160A is not programmed and no current may be conducted through the antifuse capacitor 208A, the first bit line control signal may not detect the current from the n SL and the antifuse cell 160A is read as "off". As shown in FIG. 14, according to an embodiment, the word line control signal provided to the m+1 WL controlling the gate 112B may be around −0.3V. The word line control signal provided to the m−1 WL controlling the gate 112D may be around −0.3V. The source line control signal applied to the n−1 SL connected to the antifuse capacitor 208B and the source line control signal applied to the n+1 SL connected to the antifuse capacitor 208D may be 0V. Furthermore, a voltage of around −0.7V may be applied to the substrate 100 of the antifuse device 16. When the antifuse cell 160A has been programmed (the antifuse capacitor 208A is broken down and become conductive), the first bit line control signal may detect a current from the n SL and the antifuse cell 160A is read as "on". On the other hand, when the antifuse cell 160A is not programmed and no current may be conducted through the antifuse capacitor 208A, the first bit line control signal may not detect the current from the n SL and the antifuse cell 160A is read as "off". As shown in FIG. 14, according to an embodiment, the word line control signal provided to the m+1 WL controlling the gate 112B may be around −0.3V. The word line control signal provided to the m−1 WL controlling the gate 112D may be around −0.3V. The source line control signal applied to the n−1 SL connected to the antifuse capacitor 208B and the source line control signal applied to the n+1 SL connected to the antifuse capacitor 208D may be 0V. A second bit line control signal applied to the n+1 BL may be electrically floating. Furthermore, a voltage of around −0.7V may be applied to the substrate 100 of the antifuse device 16.

According to another embodiment, on the other hand, when the antifuse cell 160C is to be read from, a word line control signal applied to the m WL may be a first voltage of around 2.5V. A source line control signal applied to the n SL may be a second voltage of around 1.2V. A second bit line control signal applied to the n+1 BL may be a reading signal. Similarly, a word line control signal provided to the m+1 WL may be around −0.3V. A word line control signal provided to the m−1 WL may be around −0.3V. A source line control signal applied to the n−1 SL B and a source line control signal applied to the n+1 SL may be 0V. A first bit line control signal applied to the n BL may be electrically floating. A voltage of around −0.7V may be applied to the substrate 100 of the antifuse device 16.

The antifuse device provided by the present invention may be conveniently formed with the DRAM device on the same substrate. Furthermore, the antifuse device provided by the present invention may effectively reduce programming or reading errors and increase the programming efficiency by using split source lines for operating the antifuse devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An antifuse device, comprising:
    a substrate having a plurality of active regions;
    a plurality of word lines formed in the substrate and extending along a first direction, each of the active regions being cut by two adjacent word lines and divided into a first doped region and two second doped regions;
    a plurality of bit lines formed on the substrate and extending along a second direction, the first doped region of each of the active regions being connected to one of the bit lines through a bit line contact structure disposed on the first doped region;
    a plurality of source lines formed on the substrate and extending along the second direction, the second doped regions of the active regions being respectively connected to one of the source lines through a source line contact structure disposed on each of the second doped regions; and
    a plurality of capacitors arranged along the second direction and respectively sandwiched between the source line contact structure and one of the source lines.
2. The antifuse device according to claim 1, wherein the first direction and the second direction are perpendicular.

3. The antifuse device according to claim 1, wherein the active regions extend along a third direction that is not perpendicular to the first direction.

4. The antifuse device according to claim 1, wherein the bit lines and the source lines are alternately arranged along the second direction from the top view.

5. The antifuse device according to claim 1, wherein the second doped regions between adjacent two of the bit lines are connected to the same one of the source lines.

6. The antifuse device according to claim 1, wherein in the cross-sectional view, the source lines are at a horizontal level higher than the bit lines with respect to a surface of the substrate.

7. The antifuse device according to claim 1, wherein the bit line contact structure extends along the second direction.

8. The antifuse device according to claim 1, wherein the capacitors respectively have a bottom metal layer, a top metal layer and an insulting layer sandwiched between the bottom metal layer and the top metal layer.

9. The antifuse device according to claim 8, wherein the bottom metal layer completely covers a top surface of the source line contact structure and has sidewalls completely aligned with sidewalls of the source line contact structure.

10. The antifuse device according to claim 8, wherein the top metal layer and the insulating layer are completely overlapped and have completely aligned sidewalls.

11. The antifuse device according to claim 8, wherein the top metal layer and the insulating layer have a first sidewall flush with a lengthwise sidewall of the source line on the top metal layer and a second sidewall completely covered by the source line on the top metal layer.

12. The antifuse device according to claim 8, wherein the top metal layer and the insulating layer have a same area that is larger than an area of the bottom metal layer.

13. The antifuse device according to claim 1, wherein the antifuse device has a $6F^2$ layout design.

14. A method of operating an antifuse device, comprising:
  providing an antifuse device, comprising:
    a plurality of word lines;
    a plurality of bit lines;
    a plurality of source lines alternately arranged with the bit lines; and
    a plurality of antifuse cells respectively comprising a transistor and a capacitor, wherein a gate of the transistor has a turn-on voltage and is connected to one of the word lines, a drain of the transistor is connected to one of the bit lines, and a source of the transistor is connected to the capacitor, wherein the capacitor has a breakdown voltage and is connected between the source of the transistor and one of the source lines, wherein a pair of the antifuse cells having the gates both controlled by an m-word line are respectively connected between an n-source line and an n-bit line and between the n-source line and an (n+1)-bit line, the n-source line being between the n-bit line and the (n+1)-bit line; and
  providing a word line control signal to the m-word line, a source line control signal to the n-source line, a first bit line control signal to the n-bit line and a second bit line control signal to the (n+1)-bit line to program or read from the pair of the antifuse cells.

15. The method according to claim 14, wherein the word line control signal is a first voltage larger than the turn-on voltage.

16. The method according to claim 15, wherein when programming one of the pair of antifuse cells, the source line control signal is a second voltage, the first bit line control signal is a third voltage, the second bit line control signal is a fourth voltage, wherein the second voltage is larger than the third voltage and the fourth voltage.

17. The method according to claim 16, wherein when programming the antifuse cell connected between the n-source line and an n-bit line, the second voltage is larger than the third voltage by a difference larger than the breakdown voltage, and the second voltage is larger than the fourth voltage by a difference smaller than the breakdown voltage.

18. The method according to claim 16, wherein when programming the antifuse cell connected between the n-source line and an (n+1)-bit line, the second voltage is larger than the third voltage by a difference smaller than the breakdown voltage, and the second voltage is larger than the fourth voltage by a difference larger than the breakdown voltage.

19. The method according to claim 15, wherein when reading from the antifuse cell connected between the n-source line and the n-bit line, the source line control signal is a fifth voltage, the first bit line control signal is a reading signal and the second bit line control signal is electrically floating.

20. The method according to claim 15, wherein when reading from the antifuse cell that is connected between the n-source line and the (n+1)-bit line, the source line control signal is a fifth voltage, the first bit line control signal is electrically floating and the second bit line control signal is a reading signal.

* * * * *